US008729389B2

(12) United States Patent
Hallett et al.

(10) Patent No.: US 8,729,389 B2
(45) Date of Patent: May 20, 2014

(54) APPARATUS COMPRISING RACK, COMPONENT, CABLE AND CABLE MANAGEMENT ASSEMBLY

(75) Inventors: Aaron Hallett, Hampshire (GB); Graham Dovell, Dorset (GB); Nicholas Coram, Bournemouth (GB)

(73) Assignee: Xyratex Technology Limited, Havant (GB)

( * ) Notice: Subject to any disclaimer, the term of this patent is extended or adjusted under 35 U.S.C. 154(b) by 566 days.

(21) Appl. No.: 12/565,418

(22) Filed: Sep. 23, 2009

(65) Prior Publication Data

US 2010/0258350 A1  Oct. 14, 2010

Related U.S. Application Data

(60) Provisional application No. 61/100,052, filed on Sep. 25, 2008.

(51) Int. Cl.
*H02G 3/00* (2006.01)
*H02G 5/04* (2006.01)
*H02G 5/06* (2006.01)

(52) U.S. Cl.
USPC ...................................................... 174/99 R

(58) Field of Classification Search
USPC ................................ 174/72 A, 69; 361/826, 827
See application file for complete search history.

(56) References Cited

U.S. PATENT DOCUMENTS

| | | | | |
|---|---|---|---|---|
| 4,614,383 A | * | 9/1986 | Polley et al. | 312/273 |
| 6,070,742 A | | 6/2000 | McAnally et al. | |
| 6,305,556 B1 | * | 10/2001 | Mayer | 211/26 |
| 6,326,547 B1 | * | 12/2001 | Saxby et al. | 174/69 |
| 6,327,159 B1 | * | 12/2001 | Davies et al. | 361/788 |
| 7,023,708 B2 | * | 4/2006 | Nguyen et al. | 361/810 |
| 7,480,154 B2 | * | 1/2009 | Lawrence et al. | 361/826 |
| 7,789,350 B2 | * | 9/2010 | Yu et al. | 248/56 |
| 2004/0065787 A1 | | 4/2004 | Hardt et al. | |
| 2006/0081736 A1 | * | 4/2006 | Chen et al. | 248/68.1 |

* cited by examiner

*Primary Examiner* — Bradley Thomas
*Assistant Examiner* — Theron Milliser
(74) *Attorney, Agent, or Firm* — Pillsbury Winthrop Shaw Pittman LLP

(57) ABSTRACT

An apparatus is disclosed including a rack; a component mounted to the rack and a cable connected at one end to the component. A cable management assembly for managing the cable has a first end fixed relative to the component and a second end fixed relative to the rack. The cable management assembly includes a first support member having a cable attachment portion that supports the cable along a first length; and, a second support member having a cable attachment portion that supports the cable along a second length. The support members are arranged to pivot with respect to each other about a pivot axis as the component moves between received and withdrawn positions in the rack. The first and second lengths of cable are offset from each other in the direction of the pivot axis.

12 Claims, 6 Drawing Sheets

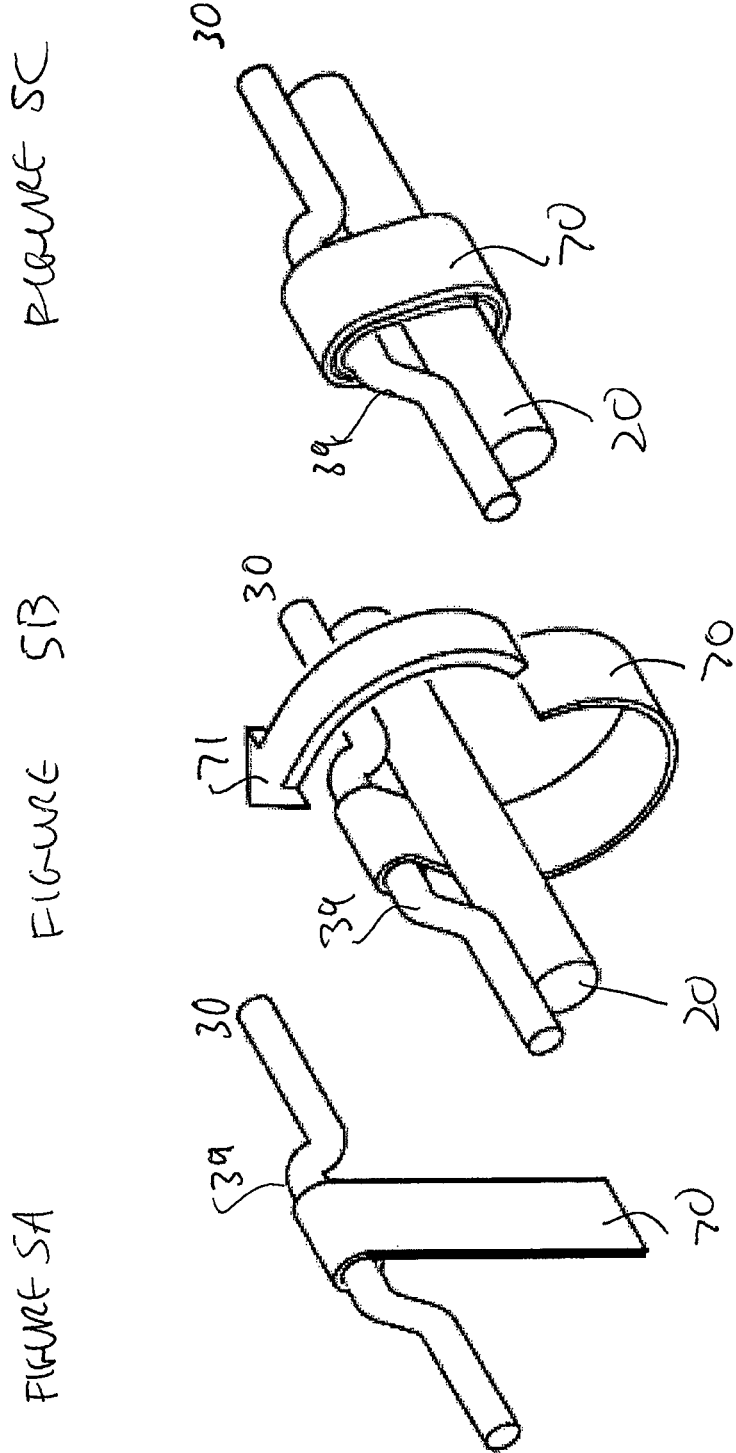

APPARATUS COMPRISING RACK, COMPONENT, CABLE AND CABLE MANAGEMENT ASSEMBLY

This application claims the benefit of priority to U.S. application Ser. No. 61/100,052, filed Sep. 25, 2008, the content of which is hereby incorporated by reference.

The present invention relates to an apparatus comprising a rack, a component, at least one cable and a cable management assembly.

In preferred embodiments, the present invention relates to a cable management assembly for rack-mounted components, for example, disk storage enclosures, network servers, and other systems where units can be moved, usually horizontally, in the rack to allow access for maintenance, etc.

Such components typically have a number of power and data cables attached at their rear. In order to allow the component to be moved relative to the rack without disconnecting the cables, the cables must have sufficient "slack". In other words, the cables must be sufficiently long and have at least a portion that is movable to accommodate the movement of the component. This potentially gives rise to a problem of the cables snagging, tangling and knotting. This may make it hard to remove cables, or may damage the cables or other components, or prevent the component from moving at all. To help address this problem, it is known in the prior art to provide some means to manage and support the cables, so that they do not get tangled or snag on other components, especially while movement of the component is taking place.

Various examples of cable management systems in the prior art comprise a movable arm along the length of which the cables are attached. For example, U.S. Pat. No. 6,070,742 discloses a cable management system where the cables are supported by a multiply-hinged arm which folds up in a concertina fashion when the unit is in the normal operational position in the rack, and extends out to a more linear form when the unit is moved to a partially withdrawn position.

A disadvantage of such movable arm systems in the prior art is that the arms typically disrupt the airflow at the rear of the enclosure, which may have an adverse effect on the ability of the enclosure to sufficiently cool itself by drawing cooling air through the enclosure. Also, such systems must be careful of observing the "minimum bend radius" of the cables, which is a measure of the degree to which a cable can be bent before there is a risk of damage to the cable. In the movable arm systems in the prior art, there is for example a risk of compromising the minimum bend radius of the cables when the movable arms are "closed up", i.e. when a smaller angle is formed between the arms. As a result, the prior art systems may not be useable with certain cables.

Another prior art system for cable management is disclosed by US-A-2004/0065787, in which the cables are given some degree of support and guidance in their range of movement by wires attached to the cables at various points along their length and wound onto spring-loaded reels. The wires unwind from the reels as the component is moved out of its normal operational position in the rack, and wind back onto the reels as the component is returned to its normal operational position. This system has the disadvantage that less support is provided to the cables, than for example by a movable arm system, since the cables are not supported by any rigid structure.

According to the present invention, there is provided apparatus comprising: a rack; a component mounted to the rack such that the component is able to move between a received position and a withdrawn position relative to the rack; at least one cable connected at one end to the component; and, a cable management assembly for managing said cable, the cable management assembly having a first end fixed relative to the component and a second end fixed relative to the rack, the cable management assembly comprising a plurality of pivotably connected support members including: at least a first support member having a cable attachment portion that supports said cable along a first length of the cable; and, at least a second support member having a cable attachment portion that supports said cable along a second length of the cable; wherein the first and second support members are arranged to pivot with respect to each other about a pivot axis as the component moves between the received and the withdrawn positions, and wherein the first and second lengths of cable are offset from each other in the direction of the pivot axis.

The first and second support members in effect form a concertina or zig-zag mechanism between the component and the rack which supports the, cable as the component is moved. As the component moves between the received and withdrawn positions in the rack, the concertina mechanism extends and retracts, i.e. the first and second support members pivot with respect to each other so that the angle between them becomes larger/smaller as appropriate.

The offset between the first and second lengths of cable allows an aperture to be left between the first and second lengths which can help with airflow to/from the component.

In preferred examples, the cable management, assembly supports the cables in a generally helically wound arrangement. The preferred embodiment of the present invention provide an arrangement in which:
(i) the full length of the cables is retained within a small space;
(ii) the airflow impedance is minimised;
(iii) the minimum bend radii of the cables is not violated;
(iv) the cables are retained within the height of the component and have minimal sag; and,
(v) hot plugging of components from the rear of the unit is not be obstructed by the cable management assembly or the cables and can be achieved without having to disconnect all connectors.

Preferably, the first support, member has a first end and a second end and the second support member has a first end and a second end, wherein the first end of the first support member is pivotably fixed relative to the component; the first end of the second support member is pivotably fixed relative to the rack; and, the second end of the first support member is pivotably connected to the second end of the second support member. This provides a simple two-bar mechanism between the component and the rack, which makes for simplicity of construction and cable routing, and ease of maintenance.

In a preferred embodiment, the first, support, member comprises a generally U-shape member, having two substantially parallel legs and a connecting portion, one of said legs providing the cable attachment, portion of the first support member, and the free ends of the legs being pivotably mounted to the component; and wherein the second support member comprises an elongate rod, the rod providing the cable attachment portion of the second support member, and being pivotably mounted at one end to the rack and being pivotably connected at the other end to the connecting portion of the first support member. This arrangement allows the cable management assembly to be formed of relatively thin members, which has the advantage tha, airflow at the rear of the component is disrupted as little as possible leading to more efficient cooling of the component. The U-shape member is pivotably connected to the component at the end of each leg, which gives greater stability to the first support member and helps, reduce, any sag. By connecting the second support member to the connecting portion of the U-shape first support member, the offset between the first and second cable attachment portions is simply achieved.

In an alternative embodiment, the first support member comprises an elongate rod, the rod providing the respective cable attachment portion and being pivotably mounted at one end to the component, and wherein the second support member comprises a generally U-shape member, having two substantially parallel legs and a connecting portion, one of said legs providing the cable attachment portion of the second support member, the free ends of the legs being pivotably mounted to the rack, and the connecting portion being pivotably connected to the end of the first support member opposite the end mounted to the component.

In a preferred embodiment, the cable management assembly comprises a rear support member being non-pivotably attached to the rack and having a cable attachment portion that supports said cable along a third length of the cable, wherein the second and third lengths of cable are offset from each other in the direction of said pivot axis between the first and second support members. The rear support member provides a convenient place to attach the cables before they are routed off to other components in the rack or to external devices. The offset between the second and third lengths of cable provides similar advantages to the offset between the first and second length of cable. In particular, the offset helps avoid contravention of the minimum bend radius of the cables as the component is moved. The offset also helps maintain a generally helical cable arrangement, allowing a cooling channel to be formed extending rearwards form the component to allow the component to cool itself efficiently.

Preferably a portion of the cable has a generally helical form extending in a rearward direction, wherein said portion includes at least the first, second and third lengths of cable and any lengths of cable between the. first, second and third lengths of cable. The helical arrangement allows the minimum bend radius to be respected. An airflow channel is formed around the centre axis of the helical, arrangement of cable. Components often use a cooling airflow to help cool the components therein. The airflow channel helps reduce resistance to airflow at the rear of the component and thus helps maximise the efficiently of the cooling arrangements in the component.

In an embodiment, said plurality of pivotably connected support members of the cable management assembly comprises at least a third support member arranged to pivot as the component moves between the received and the withdrawn positions. Additional members may be added to the first and second support member to form in effect a bigger concertina mechanism of pivoting members between the component and the rack. This could help allow a greater range of movement of the component whilst supporting additional length of the cable.

In a preferred embodiment, the second end of the first support member is pivotably attached to the second end of the second support member. This provides a simple construction. Nonetheless, a more complicated hinge arrangement could in principle be provided between the first and second support members if desired.

Preferably one or each of said cable attachment portions of the first and second support members is an elongate rod, and a projection of the rod in the direction in which the component moves has a thickness of less than 1 cm. This has the advantage that the relatively thin rods cause less airflow resistance and accordingly cause less disruption to the airflow which may be used to cool the component.

Preferably, said cable attachment portions of said first and second support members are each arranged to move in a respective one of two separate, spaced planes as the component moves.

Preferably, a projection in the direction in which the component moves of a portion of the cable has an approximate C-shape, wherein said portion includes at least the first and second lengths of cable and any length of cable between the first and second lengths of cable. "C-shape" means having substantially parallel "legs", allowing for droop etc., with a generally curved section between.

Preferably a rearward-extending channel is formed by said portion of cable, the channel allowing airflow to and/or from the component. The channel may coincide with at least one airflow vent in the component.

In a preferred embodiment, in a projection from the rear when the component is in the received position: the component has a footprint, having side edges and top and bottom edges, the distance between the top and bottom edges being defined by the height of the component; the cable attachment portion of one of the first and second support members is substantially parallel to the top edge, lying within the footprint, of the component and distant, from the top edge by no more than 10% of the height of the component; and, the cable attachment portion of the other of the first and second support members is substantially parallel to the bottom edge, lying within the footprint of the electronic component and distant from the bottom edge by no more than 50% of the height of the component.

In a preferred embodiment, in a projection from the rear when the component is in the received position: the component has a footprint having side edges and top and bottom edges, the distance between the top and bottom edges being defined by the height of the component; the first length of cable is substantially parallel to the top edge, lying within the footprint of the component and distinct from the top edge by no more than 25% of the height of the component; and, the second length of cable is substantially parallel to the bottom edge, lying within the footprint of the electronic component, and distant from the bottom edge by no more than 25%, of the height of the component.

These arrangements help keep the cables within the footprint of the component, when viewed from the rear, in the preferred arrangement where the cables are positioned below the support members to which they are attached. This eliminates or substantially reduces any interference between the cables of the component and any adjacent component in the rack and helps eliminate possible snagging of the cables when the component to be moved to its withdrawn position.

Preferably at least one of the support members is attached to the rack or to the component by a snap-fit clip that allows the member to be detached by a user without using a tool. Preferably, the cable is attached to at least one of the support members using a hook and loop strap. This helps with installing and maintaining the cables and possible hot plugging of modules in the components. No tools are required for the user to detach the cables from the support members or remove the support members from the component.

Embodiments of the present invention will, now be described by way of example with reference to the accompanying drawings, in which:

FIGS. 5A, 5B and 5C show a detailed view of the cables attached to the cable management assembly of FIG. 1; and, FIG. 6 shows an example of two adjacent storage, enclosures, according to an embodiment of the present invention.

Figure 1:
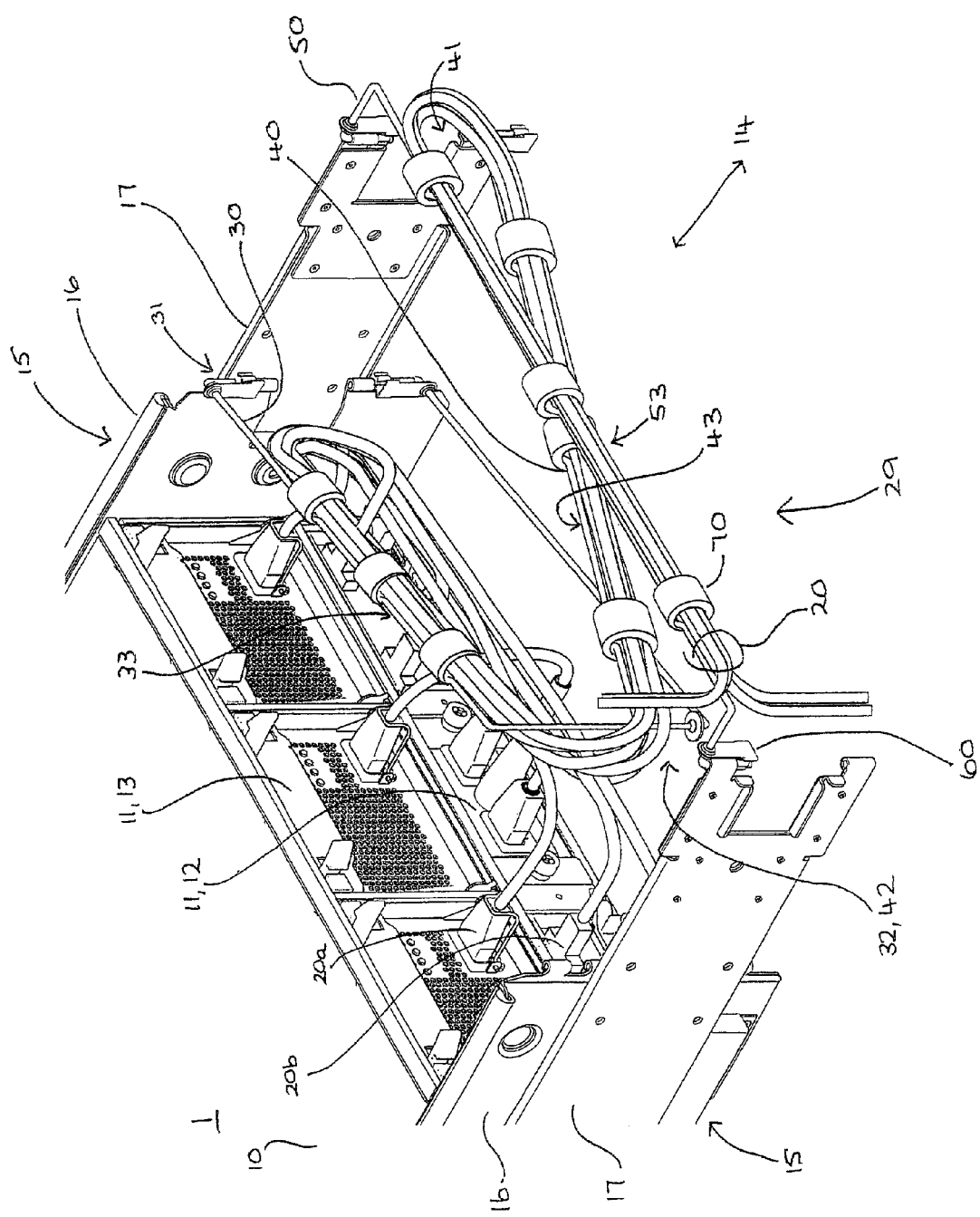
FIG. 1 shows a perspective view of an example of a storage enclosure according to an embodiment of the present invention viewed from the rear, the side and above.

FIG. 1 shows the rear of a component of the kind that contains electronic equipment and is commonly mounted in a rack. In the present example, the component is a storage enclosure 1 containing a plurality of disk drive units which may be organised for example as RAID ("Redundant Array Of Inexpensive Disks") or JBOD ("Just A Bunch Of Disks"). The storage enclosure 1 comprises a chassis 10 having a plurality of bays 11 defined within. The front of the storage enclosure 1 has bays, in which the disk drive units are received (not shown). The rear of the storage enclosure 1 has bay 11 in which controller modules 12 and power supply modules 13 are received.

The storage enclosure 1 has internal fans or other air movement devices (not shown) to create an airflow through the enclosure to help cool the various modules within. As is typical, the airflow is "front-to-back", i.e air is drawn into the enclosure at the front is used to cool the various modules in the enclosure and finally vented at the rear of the enclosure.

The storage enclosure 1 is arranged to be mounted in a rack (not shown). Suitable racks are commercially available, and are not described in detail in the present description. Nonetheless, in short, a suitable rack may comprise a cabinet having vertical posts disposed at its sides to which the storage enclosure can be attached by suitable fixings and thereby supported in the cabinet in a horizontal orientation.

In the present example, the storage enclosure 1 is attached to the rack by slide rail assemblies 15 on each side. The slide rail assemblies 15 support the storage enclosure 1 in the rack and also allow the storage enclosure to be moved horizontally forward and backward in the rack (indicated by arrow 14 in FIG. 1). Various arrangements of the slide rail assemblies 15 are possible and commercially available. In the present example, each slide rail assembly 15 comprises a chassis rail 16 attached to the side of the chassis 10 of the storage enclosure 1, and a rack rail 17 arranged to be attached to the rack, e.g. to the mounting posts of the rack. The chassis rail 16 and rack rail 17 are arranged such that the chassis rail 16 can extend relative to the rack rail 17 in a lengthwise direction. Bearings and/or intermediate rails may be disposed between the rack rail 17 and the chassis rail 16 to aid the movement of the rails.

In practice, the slide rail assemblies 15 allow the storage enclosure 1 to be moved between a received position where the storage enclosure 1 is fully received within the footprint of the rack for when the storage enclosure 1 is in normal use, and a withdrawn position where the storage enclosure 1 is moved forwards to be partially or fully outside the footprint of the rack to allow access to the rear of the storage enclosure 1 for maintenance, etc. For ease of illustration FIG. 1 shows the storage enclosure. 1 in an intermediate position in which it is part way between its received and fully withdrawn positions.

Note, as is conventional, references to "front", "back", "side", "horizontal", "vertical", etc. in relation to the storage enclosure 1 or rack are given with reference to the orientation of a conventionally mounted component, i.e. one mounted horizontally in a rack. Nonetheless, these terms should also be construed accordingly to cover a situation where the enclosure is arranged so as to be turned on its side to be vertically arranged, or indeed in any orientation.

Typically, as in the present example, most if not all of the external connections to the storage enclosure 1 are made by cables 20 attaching at the rear of the enclosure 1, namely to connectors mounted on the rear faces of the modules 12,13 in the rear bays 11. In particular, power cables 20a are connected to the power supply modules 13 at the rear so that power can be provided to the enclosure 1. Also, data cables 20b are connected to the controller modules 12 at the rear so that the controller modules 12 can be connected to external devices, such as a host computer, or be connected to other controller modules 12 in the enclosure 1 or in other enclosures. The cables 20 need to have sufficient slack to allow the enclosure 1 to be moved forwards in the rack to its withdrawn position.

A cable management assembly 29 is provided for managing and providing support to the cables 20. The cable management assembly 29 comprises a first support member 30, a second support member 40 and a rear support member 50. The first support member 30 has a first end 31 at which it is pivotably attached to the chassis rail 16. The second support member 40 has a first end 41 at which it is pivotably attached to the rack rail 17. The second end 32 of the first support member 30 is pivotably attached to the second end 42 of the second support member 40. Thus, the first and second support members 30,40 form a "concertina" or "zig-zag" mechanism, the ends of which are fixed in position between the enclosure 1 and the rack such that the mechanism opens and closes about the pivots as the enclosure 1 is moved forwards and backwards in the rack. The rear support member 50 is attached between the rack rails 17 extending across the rear of the rack. The first, second and rear support members 30,40,50 have respective first, second and rear cable attachment portions 33,43,53 along which straps 70 are spaced to allow the cables 20 to be attached to the support member. Thus, the cables 20 are supported by the cable management assembly 29 as the enclosure 1 moves.

Figure 2:
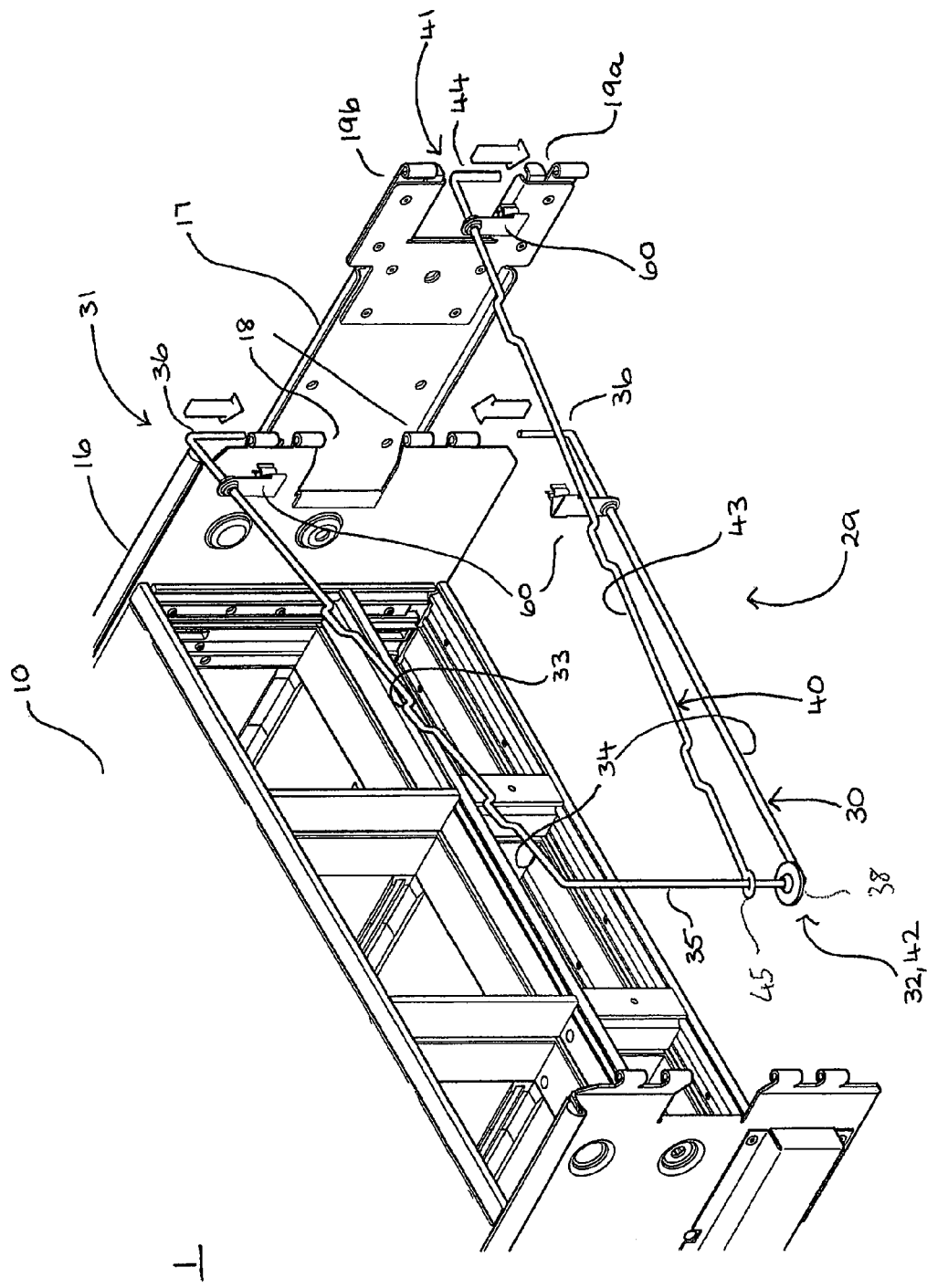
FIG. 2 shows a partially exploded view of elements of the storage enclosure of FIG. 1.

FIG. 2 shows the arrangement of the first and second support members 30,40 in more detail. The first support member 30 comprises a generally U-shape member, i.e having two parallel legs 34 and a connecting portion 35 from which the legs 34 depend. The upper leg 34 provides the first cable attachment portion 33. Pivot shafts 36 are attached to the ends of the parallel legs 34, extending inwardly perpendicular to the legs. The rear extremity of the left-side, chassis rail 16 has two pivot holes 18 formed in it, the holes 18 being vertically orientated one above the other. These each receive a respective pivot shaft 36 of the first support member 30. The first support member 30 has sufficient resilience to allow its ends to be separated far enough to allow the pivot shafts 36 to enter their respective holes 18. A clip 60 (described in more detail below) holds each pivot shaft 36 in place in its pivot hole 18. Thus arranged, the first end 31 of the first support member 30 is fixed in position relative to the storage enclosure 1 and is capable of pivoting relative to the storage enclosure 1 about a vertical pivot axis.

The second support member 40 comprises a generally straight elongate member which provides the second cable attachment portion 43. The elongate member has a pivot shaft 44 attached at one end, which extends generally perpendicularly to the elongate member. The rear extremity of the left-side rack rail 17 has a pivot hole 19a formed in it which is vertically orientated. The pivot hole 19a receives the pivot shaft 44 of the second support member 40. A clip 60 holds the pivot shaft 44 in place in its pivot hole 19a. Thus arranged, the first end 41 of the second support member 40 is fixed in position relative to the rack and is capable of pivoting relative to rack about a vertical pivot axis.

The second support member 40 contains a pivot hole 45 near its second end 42. During assembly, the top end of the first support member 30 is passed through the pivot hole 45 and passed through it until the pivot hole 45 is positioned about a quarter of the way up the connecting portion 35 of the first support member 30 when fully assembled. A washer 38a and a grommet 38b are fitted at the bottom of the connecting portion 35 to prevent the pivot hole 45 from slipping around the corner onto the bottom parallel leg 34 during assembly. Thus arranged, the connecting portion 35 can turn in the pivot hole 45, forming a pivot between the first and second support members 30,40 at their second ends 32,42 having a generally vertical pivot axis. In some examples (not shown), means may be provided to hold the pivot hole 45 in the required position relative to the connecting portion 35, such as a suitably, positioned kink (not shown) in the connecting portion 35. Thus, a concertina mechanism is formed between the first and second support members 30,40, wherein both pivot about generally vertical axes as the storage enclosure 1 is moved in the rack.

Figure 3:
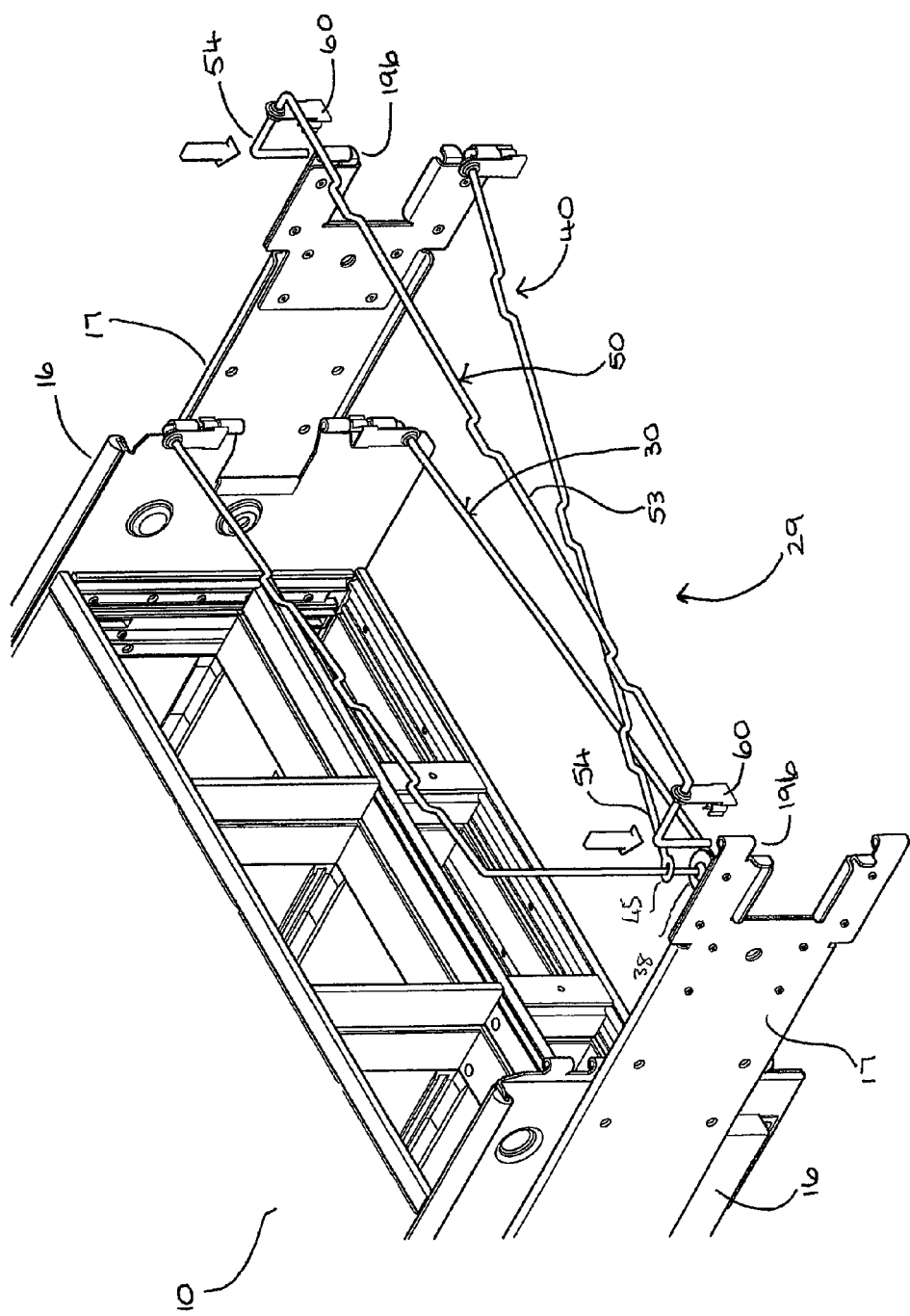
FIG. 3 shows a partially, exploded view of elements of the storage enclosure of FIG. 1.

FIG. 3 shows in more, detail the attachment of the rear support member 50 across the width of the rack at the rear. The rear support member 50 comprises a rod-like member, which provides the rear cable support portion 53, having shafts 54 at each end which extend perpendicularly to the rod-like member. The rear extremities of the left-side and right-side rack rails 17 have holes 19b formed therein which receive a respective, one of the shafts 54. Clips 60 hold the shafts 54 in place in the holes 19b. Thus arranged, the rear support member 50 is fixed in position across the rear of the rack.

Figure 4A:
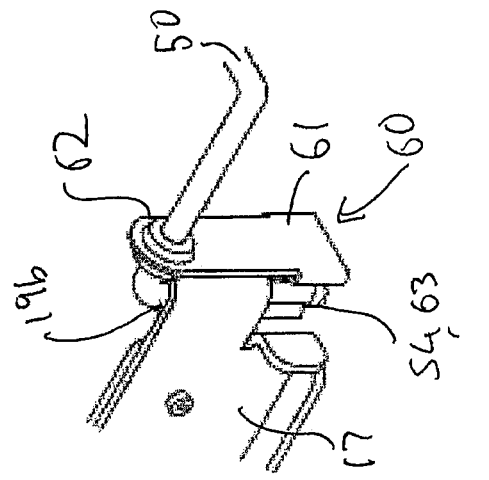
FIGS. 4A, 4B and 4C show a detailed view of the clips of FIG. 1.
Figure 4B:
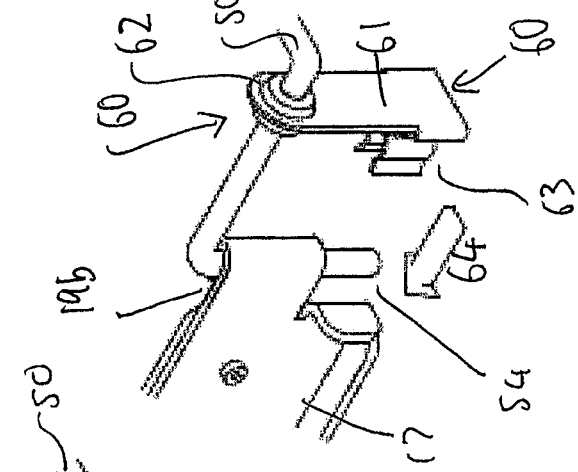
Figure 4C:
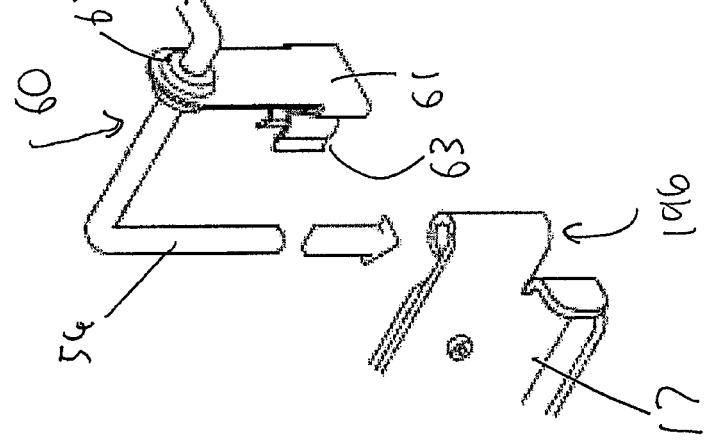

FIGS. 4A to 4C show the construction and arrangement of a clip 60 in more detail, referring by way of example to the clip connection formed between the rear support member 50 and the rack rail 17. The clip 60 comprises a body 61 portion having a hole 62 in one end and a pair of resilient arms 63 at the other end. To secure the shaft 54 in the receiving hole 19b in the rack rail 17, the shaft 54 is first passed through the hole 62 in the clip 60, as shown in FIG. 4A. The shaft 54 is then fully inserted into the receiving hole 19b, such that the free end of the shaft 54 extends, out of other side of the receiving hole 19b, as shown by FIG. 4B. The clip 60 is then advanced towards the shaft 54, as shown by the arrow 64 in FIG. 4C, until the resilient arms 63 clasp around the end of the shaft 54. Thus, the clip 60 can be snap-fitted to the shaft 54 to prevent the shaft 54 from being removed from the receiving hole 19b. The clip 60 operates in a similar way when used in a pivot connection, in which the clip 60 does not interfere with the ability of the pivot shaft to pivot in its pivot hole. The clips 60 make it simple for the support member to be installed and/or removed from the storage enclosure/rack by hand without the need of tools to undo conventional fasteners. The clips 60 allow removal of part of the cable management assembly whilst not having to untie or disconnect any of the cables 20 from the support members 30,40,50 or the storage enclosure 1. This allows simple and fast hot plugging of modules 12,13 from the rear of the storage enclosure 1.

As shown in more detail in FIGS. 5A to 5C, the cables 20 are preferably attached to the support members by hook-and-loop straps 70 spaced at intervals along the. member 30. One end of each hook-and-loop strap 70 is attached to the member. The support member 30 has a kinked portion 39 coinciding with the desired position of each straps 70 to help retain the straps 70 in position. The cables 20 are then positioned against the support member 30 and each strap 70 is fastened around both (shown by arrow 71) to hold the cables 20 in position against the support member 30. The cables 20 are preferably strapped so as to hang underneath the support member 30. This helps prevent the cable 20 from shifting its position under the effects of gravity when the cables 20 are disturbed on moving the enclosure 1 backwards or forwards. Using hook-and-loop straps 70 minimises the time spent on cable routing and assembly, allowing the operator to change the set up quickly and simply.

Referring again to FIG. 1, the cables 20 are attached to the cable management assembly 29 in the following manner. Starting from the enclosure end of the cables, the cables 20 are routed along the first cable support portion 33 of first support member 30, running from near its first end 31 to near its second end 32. The cables 20 then double back on themselves as they are routed along the cable attachment portion 43 of the second support member 40 from near its second end 42 to near its first end 41. Some or all of the cables 20 then double back on themselves again as they are routed along the cable attachment portion 53 of the rear support member 50. The cables 20 may then be routed off to other devices in the rack, or external to the rack as desired.

Due to the arrangement of the first and second support members 30,40, the first cable attachment portion 33 moves in a plane or level that is separate and spaced from that of the second cable attachment portion 43. In other words, in a rear projection, the first cable attachment portion 33 is axially offset from the second cable attachment portion 43 in the direction of the pivot axis between the first and second support members 30,40, i.e. offset vertically in the present example where the pivot axis is vertical. This means that the length of the cables running between the first and second support portions 33,43, i.e. in the vicinity of the pivot, must run in that direction. This means that the cables 20 double back on themselves and are offset in the direction of the pivot to form a C-shape in that portion of the cables when viewed from the rear.

Having the first and second support members 30,40 move in separate, spaced planes means that the bend in the cables 20 is not made substantially tighter, i.e. made to be a sharper bend, even when the angle between the first, and second support members 30,40 becomes smaller as the enclosure 1 is moved home in the rack. Indeed, the C-shape in the cable 20 keeps approximately the same shape when the enclosure 1 is moved. This has the advantage that the bend radius of the cables 20 is not compromised. This helps protect the cables 20 from damage as the enclosure is moved.

Similarly, the rear support member 50 is generally at the same height as the cable attachment portion 33, of the first support member 30. One end of the rear member 50 coincides with the axis about which the second support, member 40 pivots with the rack rail 17. Thus, the second cable attachment portion 43 moves in a plane that is below the third cable attachment portion 53. Thus where cable 20 goes from the second support member 40 to the rear support member 50, the cable 20 drops down the distance between the two planes in the direction of the pivot axis, i.e. vertically in this example where the second support member 40 pivots about a vertical axis. Thus, the length of cable 20 extending from the second support member 40 to the rear support member 50 extends downwards in the direction of the pivot axis of the second support member 40 and the rack. Thus, when viewed from the rear, another C-shape is formed by the portion of cable 20 extending between the second support member 40 and the rear support member 50. This also protects the minimum bend radius of the cable 20 in the vicinity of the pivot when the second support member 40 pivots and the angle between the second support member 40 and the rear support member 50 becomes smaller.

Thus, the cables 20 attached to the cable management assembly 29 have a general helical shape. In other words, when viewed from above, the cables 20 have a general concertina form, matching the position of the cable support members 30,40,50. When viewed from behind, the cables 20 wind around a rearward-extending aperture. As the enclosure 1 is moved forwards, the pitch of the helix in effect increases, maintaining the aperture. This aperture reduces resistance to airflow from the back of the enclosure 1. This means that the enclosure 1 is better able to cool itself by maintaining a greater airflow because the cables 20 and cable management assembly 29 offer less, resistance to the airflow used to cool the enclosure 1. Preferably, the aperture may be aligned with airflow vents in the rear of the enclosure 1 to further reduce resistance to airflow. For example, the aperture may be aligned with rear fans of the power supply modules 13.

The first, second and rear support members 30,40,50 are preferably constructed from a thin but rigid material, such as a length of metal wire or rod. The members may then be formed by bending the rod to the appropriate shape, which provides a simple method of construction. The support members 30,40,50 allow the cable 20 to be supported, whilst having a relatively small cross sectional area, especially when viewed from the rear, so as to minimise any disruption of the airflow of the enclosure 1. Preferably, the members are no more than 1 cm thick.

The support members 30,40,50 are arranged so that the support members 30,40,50 and the cables 20 attached to the support members are within the footprint of the enclosure 1 when viewed from the rear. The cables 20 are preferably attached underneath the members 30,40,50. The first support member 30 is close to the top of the footprint, preferably distant from the top edge of the footprint by no more than 10% of the height of the enclosure 1. The cables 20 attached underneath the first support member 30 are thus also kept within the footprint. The second support member. 40 is arranged lower down the footprint of the enclosure 1, preferably distant from the bottom edge by no more than 50%. of the height of the enclosure 1. In the present example, the second support member is about 25% of the height of the enclosure from the bottom edge of the footprint. This 25% space under the second support member 40 allows sufficient space for the cables 20 hanging underneath so that they are also kept in the footprint. The rear support member 50 is close to the top of the footprint so that the cables 20 hanging underneath are within the footprint. Thus, the cables 20 are kept in the footprint of the enclosure 1 and do not interfere with adjacent components in the rack.

Figure 6:
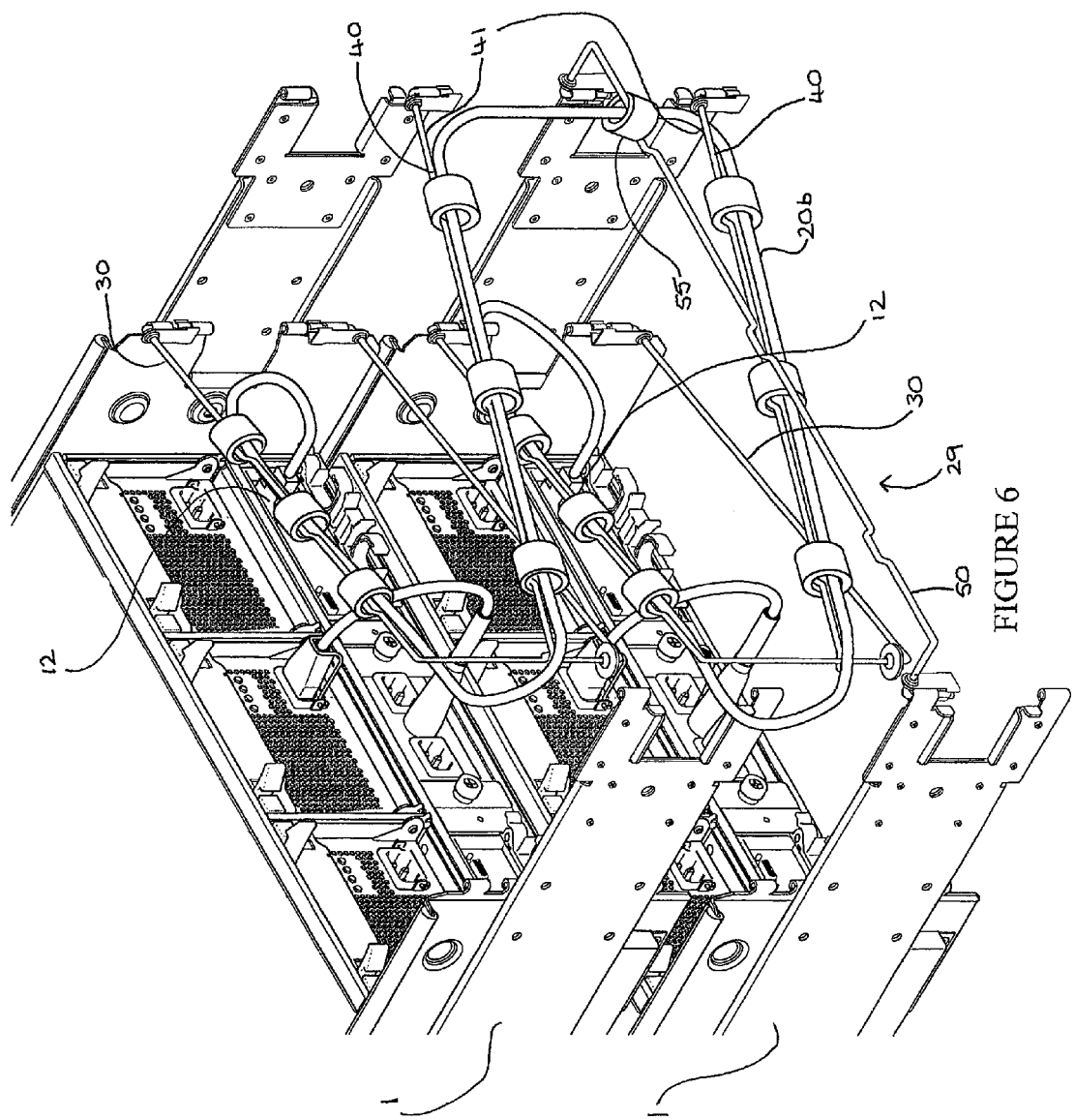

FIG. 6 shows two storage enclosures 1 arranged one above the other. This illustrates the routing of a data cable 20b between controller modules 12 on the two adjacent enclosures 1. As can be seen, the cable 20b is not attached horizontally along the rear cable attachment portion 53 in this case. Instead, the cable 20b extends vertically between the first ends 41 of the second support members 40 of the two enclosures 1. The vertical extending portion of the cable 20b running between the two enclosures 1 can be attached to the rear support member 50 where it crosses the rear support member 50 to hold the cable 20b in position. This arrangement allows one storage enclosure 1 to be pulled out while the other storage enclosure 1 remains in the received position, with the cables 20 remaining connected to both storage enclosures 1 throughout the process. It will also be appreciated that the obstruction to cooling airflow is minimal.

The cable management assembly 29 easily manages bundles of thick cables 20 such as four SAS cables (each having a diameter of approximately 8.5 mm) in addition to two power cables (each having a diameter of approximately 7.5 mm) whilst also allowing multiple fibre channel cables of lesser size to be used on the same system in a different set-up. For example, a SAS cable has a specified minimum bend radius of 15 mm when static and 30 mm when moving. A preferred minimum bend radius to be used in practice is 60 mm. The cable management assembly 29 described above provides an advantageous way to respect the desired minimum bend radius for such cables in a rack environment. The cable management assembly 29 is potentially suitable for use with all common types of cables, cable thickness and set-ups.

The cable management assembly 29 when fully loaded with thick cables such as SAS and power leads has minimal sag and keeps itself and the cables 20 within the footprint of the storage enclosure 1 when viewed from the rear. This reduces the risk of cable damage during movement of the enclosure 1 and from adjacent enclosures 1 above and below in the rack.

In the present examples, the support members 30,40,50 have been described as being attached to the rails 16,17 of the slide rail assembly 15. Nonetheless, it will be appreciated that other arrangements are possible. For example, rather than being attached to the chassis rail 16, the first support member 30 may be fixed to the chassis 10 of the storage enclosure 1, or to a module 12,13 in the storage enclosure 1. Furthermore, it may be fixed indirectly to the storage enclosure 1 or rail 16, for example, via a bracket. Similarly the second support member 40 can be fixed to the rack rail 17, or to the rack. As will be appreciated, the important factor is that one end of the first support member 30 is fixed relative to the storage enclosure 1, one end of the second support member 40 is fixed relative to the rack, and that the first and second support members can pivot with respect to each other. In principle, any suitable attachment point or means may be used to accomplish this. Similarly, the rear support 50 member may be attached directly to the rack instead of to the rack rail 17.

The cable management assembly 29 described so far has two pivoting support members 30,40 between the enclosure 1 and the rack. However, one or more additional pivoting, support members may be included in the cable management assembly 29 if desired, to create in effect an extended concertina mechanism. The extended concertina mechanism may be helpful in allowing the storage enclosure 1 to be moved greater distances in the rack whilst providing support for the cables 20. For example, a third pivoting support member may be included. In this arrangement, instead of the second support member 40 being pivoted to the rack, the second support member 40 may be pivoted to one end of the third support member, the other end of which is pivoted to the rack. Other arrangements of the support members are possible. The additional members would preferably also have cable attachment portions to which the cable is attached. The additional, members may also be arranged such that the cable undergoes a translation in the direction of the pivot axis when moving to and/or from that member from an adjacent member. This maintains the helical arrangement of the cable with the advantages mentioned above.

Embodiments of the present, invention have been described with particular reference to the example illustrated. However, it will be appreciated that variations and modifications may be made to the examples described within the scope of the present invention.

The invention claimed is:
1. An apparatus comprising:
 a rack;
 a component mounted to the rack such that the component is able to move between a forward position and a rear- ward position relative to the rack, wherein in the forward position the component is withdrawn from the rack and in the rearward position the component is received in the rack;

at least one cable connected at one end to the component; and a cable management assembly for managing said cable, the cable management assembly having a first end fixed relative to the component and a second end fixed relative to the rack, the cable management assembly comprising a plurality of pivotably connected support members including:

at least a first support pivotable member formed from a thin rod having a thickness of less than 1 cm and having a cable attachment portion that supports said cable along a first length of the cable; and at least a second support pivotable member formed from a thin rod having a thickness of less than 1 cm and having a cable attachment portion that supports said cable along a second length of the cable, wherein the first and second support members are arranged to pivot with respect to each other about a pivot axis as the component moves between the received and the withdrawn positions, and wherein the first and second lengths of cable are offset from each other in the direction of the pivot axis, wherein a rearward-extending channel is formed between the lengths of cable attached to the cable attachment portions of the first and second support members, the channel allowing airflow to or from the component, wherein the first support member is a generally U-shape member, having an upper arm, a lower arm, and a connecting portion, and the free ends of the arms are each separately pivotably mounted to the component by respective vertically spaced apart pivots, one pivot being located in the top half of the component and the other pivot being located in the bottom half of the component such that when the component moves relative to the rack the upper and lower arms pivot in respective vertically spaced apart horizontal planes, the upper arm having a thickness of less than 1 cm and providing the cable attachment portion of the first support member, wherein the second support member is an elongate rod having a thickness of less than 1 cm and providing the cable attachment portion of the second support member, and being pivotably mounted at one end to the rack and being pivotably connected at the other end to the connecting portion of the U-shape member, such that the second support member pivots in a horizontal plane that is entirely positioned between and spaced apart from said horizontal planes of the upper and lower arms and such that the second support member is braced from above by the upper arm and from below by the lower arm, and wherein in a rearward projection when the component is in the rearward, received position:

the component has a footprint, having side edges and top and bottom edges, the distance between the top and bottom edges being defined by the height of the component;

the horizontal elongate rod forming the cable attachment portion of the first support member is substantially parallel to the top edge, lying within the footprint of the component and such that no part of the cable attachment portion of the first support member is distant from the top edge by more than 10% of the height of the component; and the horizontal elongate rod forming the cable attachment portion of the second support member is substantially parallel to the bottom edge, lying within the footprint of the component and such that no part of the cable attachment portion of the second support member is distant from the bottom edge by more than 50% of the height of the component.

2. The apparatus according to claim 1, wherein the cable management assembly comprises a rear support member being non-pivotably attached to the rack and having a cable attachment portion that supports said cable along a third length of the cable, wherein the second and third lengths of cable are offset from each other in the direction of said pivot axis between the first and second support members.

3. The apparatus according to claim 2, wherein a portion of the cable has a generally helical form extending in a rearward direction, wherein said portion includes at least the first, second and third lengths of cable and any lengths of cable between the first, second and third lengths of cable.

4. The apparatus according to claim 1, wherein a projection in the direction in which the component moves of a portion of the cable has an approximate C-shape, wherein said portion includes at least the first and second lengths of cable and any length of cable between the first and second lengths of cable.

5. The apparatus according to claim 1, wherein the channel coincides with at least one airflow vent in the component.

6. The apparatus according to claim 1, wherein in a rearward projection when the component is in the received position:

the component has a footprint having side edges and top and bottom edges, the distance between the top and bottom edges being defined by the height of the component;

the first length of cable is substantially parallel to the top edge, lying within the footprint of the component and distinct from the top edge by no more than 25% of the height of the component; and, the second length of cable is substantially parallel to the bottom edge, lying within the footprint of the component and distant from the bottom edge by no more than 25% of the height of the component.

7. The apparatus according to claim 1, wherein the cable is attached to at least one of the support members using a hook and loop strap.

8. An apparatus comprising:

a rack;

a component mounted to the rack such that the component is able to move between a received position and a withdrawn position relative to the rack;

at least one cable connected at one end to the component; and a cable management assembly for managing said cable, the cable management assembly having a first end fixed relative to the component and a second end fixed relative to the rack, the cable management assembly comprising a plurality of pivotably connected support members including:

at least a first support member having a cable attachment portion that supports said cable along a first length of the cable; and at least a second support member having a cable attachment portion that supports said cable along a second length of the cable, wherein the first and second support members are arranged to pivot with respect to each other about a pivot axis as the component moves between the received and the withdrawn positions, and wherein the first and second lengths of cable are offset from each other in the direction of the pivot axis, wherein at least one of the first and second support members comprises an elongate rod having a thickness of less than 1 cm, wherein part of the elongate rod provides said cable attachment portion of that support member, wherein an end part of the elongate rod is angled relative to the cable attachment portion of the elongate rod in the direction of the pivot axis and is received in a hole in either the rack or the component such that a projecting portion of the end part of the elongate rod projects beyond the hole, wherein the at least one support member can pivot in the hole, and wherein the at least one support member is attached to the rack or to the component by a snap-fit clip that allows the at least one of the first and second support members to be detached by a user without using a tool, the snap-fit clip comprising a first part having a through-hole through which the cable attachment portion of the elongate rod extends, and a second part that clips to the projecting portion of the elongate rod so as to retain the end part of the support member in the hole.

9. An apparatus comprising:

a rack;

a component mounted to the rack such that the component is able to move between a forward position and a rearward position relative to the rack, wherein in the forward position the component is withdrawn from the rack and in the rearward position the component is received in the rack;

at least one cable connected at one end to the component; and a cable management assembly for managing said cable, the cable management assembly having a first end fixed relative to the component and a second end fixed relative to the rack, the cable management assembly comprising a plurality of pivotably connected support members including:

at least a first pivotable support member formed from a thin rod having a thickness of less than 1 cm and having a cable attachment portion that supports said cable along a first length of the cable; and at least a second pivotable support member formed from a thin rod having a thickness of less than 1 cm and having a cable attachment portion that supports said cable along a second length of the cable, wherein the first and second support members are arranged to pivot with respect to each other about a pivot axis as the component moves between the received and the withdrawn positions, and wherein the first and second lengths of cable are offset from each other in the direction of the pivot axis, wherein a rearward-extending channel is formed between the lengths of cable attached to the cable attachment portions of the first and second support members, the channel allowing airflow to and/or from the component, wherein the first support member is a generally U-shape member, having an upper arm, a lower arm and a connecting portion, and the free ends of the arms are each separately pivotably mounted to the rack by respective vertically spaced apart pivots, one pivot being located in the top half of the rack and the other pivot being located in the bottom half of the rack such that when the component moves relative to the rack the upper and lower arms pivot in respective vertically spaced apart horizontal planes, the upper arm having a thickness of less than 1 cm and providing the cable attachment portion of the first support member, wherein the second support member is an elongate rod having a thickness of less than 1 cm and providing the cable attachment portion of the second support member, and being pivotably mounted at one end to the component and being pivotably connected at the other end to the connecting portion of the U-shape member, such that the second support member pivots in a horizontal plane that is entirely positioned between and spaced apart from said horizontal planes of the upper and lower arms and such that second support members is braced from above by the upper arm and from below by the lower arm, and wherein in a rearward projection when the component is in the rearward, received position:

the component has a footprint, having side edges and top and bottom edges, the distance between the top and bottom edges being defined by the height of the component;

the horizontal elongate rod forming the cable attachment portion of the first support member is substantially parallel to the top edge, lying within the footprint of the component and such that no part of the cable attachment portion of the first support member is distant from the top edge by more than 10% of the height of the component; and the horizontal elongate rod forming the cable attachment portion of the second support member is substantially parallel to the bottom edge, lying within the footprint of the component and such that no part of the cable attachment portion of the second support member is distant from the bottom edge by more than 50% of the height of the component.

10. The apparatus according to claim 9, wherein a projection in the direction in which the component moves of a portion of the cable has an approximate C-shape, wherein said portion includes at least the first and second lengths of cable and any length of cable between the first and second lengths of cable.

11. The apparatus according to claim 9, wherein the channel coincides with at least one airflow vent in the component.

12. The apparatus according to claim 9, wherein in a projection from the rear when the component is in the received position:

the component has a footprint having side edges and top and bottom edges, the distance between the top and bottom edges being defined by the height of the component;

the first length of cable is substantially parallel to the top edge, lying within the footprint of the component and distinct from the top edge by no more than 25% of the height of the component; and the second length of cable is substantially parallel to the bottom edge, lying within the footprint of the component and distant from the bottom edge by no more than 25% of the height of the component.

* * * * *